(12) United States Patent
Trivedi et al.

(10) Patent No.: US 10,950,313 B1
(45) Date of Patent: Mar. 16, 2021

(54) RESPONDING TO CHANGES IN AVAILABLE POWER SUPPLY

(71) Applicant: MICRON TECHNOLOGY, INC., Boise, ID (US)

(72) Inventors: Avani F. Trivedi, Eagle, ID (US); Tracy D. Evans, Boise, ID (US); Carla L. Christensen, Boise, ID (US); Tomoko Ogura Iwasaki, San Jose, CA (US); Aparna U. Limaye, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,241

(22) Filed: Aug. 28, 2019

(51) Int. Cl.
 G11C 16/30 (2006.01)
 G11C 16/10 (2006.01)
 G06F 13/16 (2006.01)
 G11C 5/14 (2006.01)

(52) U.S. Cl.
 CPC .......... G11C 16/30 (2013.01); G06F 13/1668 (2013.01); G11C 16/10 (2013.01); G11C 5/144 (2013.01)

(58) Field of Classification Search
 CPC ......... G11C 16/30; G11C 16/10; G11C 5/144; G06F 13/1668
 USPC ....................................................... 365/226
 See application file for complete search history.

(56) References Cited

U.S. PATENT DOCUMENTS

| | | | |
|---|---|---|---|
| 8,886,911 B2 | 11/2014 | Nemazie et al. | |
| 2004/0095834 A1 | 5/2004 | Chevallier | |
| 2004/0164849 A1* | 8/2004 | Alvarez | H04L 12/66 340/2.9 |
| 2004/0193955 A1* | 9/2004 | Leete | G06F 11/2015 714/22 |
| 2008/0005474 A1* | 1/2008 | Long | G06F 12/0871 711/118 |
| 2011/0093654 A1* | 4/2011 | Roberts | G06F 12/121 711/105 |
| 2012/0108224 A1* | 5/2012 | Cheng | H04W 52/028 455/418 |
| 2012/0131145 A1* | 5/2012 | Garg | H04W 4/18 709/219 |
| 2015/0026416 A1 | 1/2015 | Nemazie et al. | |

(Continued)

OTHER PUBLICATIONS

Glen, Dave, "Optimized Client Computing With Dynamic Write Acceleration," Technical Brief, Micron Technology, Inc., 2014, pp. 5.

*Primary Examiner* — Sung Il Cho
(74) *Attorney, Agent, or Firm* — Dicke, Billig & Czaja, PLLC

(57) ABSTRACT

Methods of operating a memory having a first pool of memory cells having a first storage density and a second pool of memory cells having a second storage density greater than the first storage density, as well as apparatus configured to perform similar methods, might include determining whether a value of an indication of available power is less than a threshold, and, in response to determining that the value of the indication of available power is less than the threshold, increasing a size of the first pool of memory cells, limiting write operations of the memory to the first pool of memory cells, and postponing movement of data from the first pool of memory cells to the second pool of memory cells.

25 Claims, 10 Drawing Sheets

(56) References Cited

U.S. PATENT DOCUMENTS

2015/0363285 A1\* 12/2015 Delaney .............. G06F 11/1451
714/6.12
2018/0060231 A1\* 3/2018 Kelly .................. G06F 12/0868
2018/0336146 A1 11/2018 Blodgett et al.

\* cited by examiner

| $350_0$ | $350_1$ | $350_2$ | $350_3$ |
|---|---|---|---|
| Block$_0$ 250$_0$ | Block$_0$ 250$_0$ | Block$_0$ 250$_0$ | Block$_0$ 250$_0$ |
| Block$_1$ 250$_1$ | Block$_1$ 250$_1$ | Block$_1$ 250$_1$ | Block$_1$ 250$_1$ |
| Block$_2$ 250$_2$ | Block$_2$ 250$_2$ | Block$_2$ 250$_2$ | Block$_2$ 250$_2$ |
| Block$_3$ 250$_3$ | Block$_3$ 250$_3$ | Block$_3$ 250$_3$ | Block$_3$ 250$_3$ |
| Block$_4$ 250$_4$ | Block$_4$ 250$_4$ | Block$_4$ 250$_4$ | Block$_4$ 250$_4$ |
| ⋮ | ⋮ | ⋮ | ⋮ |
| Block$_{L-4}$ 250$_{L-4}$ | Block$_{L-4}$ 250$_{L-4}$ | Block$_{L-4}$ 250$_{L-4}$ | Block$_{L-4}$ 250$_{L-4}$ |
| Block$_{L-3}$ 250$_{L-3}$ | Block$_{L-3}$ 250$_{L-3}$ | Block$_{L-3}$ 250$_{L-3}$ | Block$_{L-3}$ 250$_{L-3}$ |
| Block$_{L-2}$ 250$_{L-2}$ | Block$_{L-2}$ 250$_{L-2}$ | Block$_{L-2}$ 250$_{L-2}$ | Block$_{L-2}$ 250$_{L-2}$ |
| Block$_{L-1}$ 250$_{L-1}$ | Block$_{L-1}$ 250$_{L-1}$ | Block$_{L-1}$ 250$_{L-1}$ | Block$_{L-1}$ 250$_{L-1}$ |
| Block$_L$ 250$_L$ | Block$_L$ 250$_L$ | Block$_L$ 250$_L$ | Block$_L$ 250$_L$ |
| 240$_0$ | 240$_1$ | 240$_2$ | 240$_3$ |

RESPONDING TO CHANGES IN AVAILABLE POWER SUPPLY

TECHNICAL FIELD

The present disclosure relates generally to memory and, in particular, in one or more embodiments, the present disclosure relates to methods of operating memory in response to changes in available power supply.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Many devices using non-volatile memory are portable in nature and provide for a stand-alone power supply, e.g., a battery. While stand-alone power supplies provide for mobility, e.g., detached from a line-connected power supply, they also have finite amounts of available power, which might be expressed as a charge level. It is generally desirable to increase the usable life of a stand-alone power supply to improve the mobility of its corresponding device.

BRIEF DESCRIPTION OF THE DRAWINGS

FIG. 3 is a block schematic of a portion of an array of memory cells as could be used in a memory of the type described with reference to FIG. 1.

DETAILED DESCRIPTION

Figure 1:
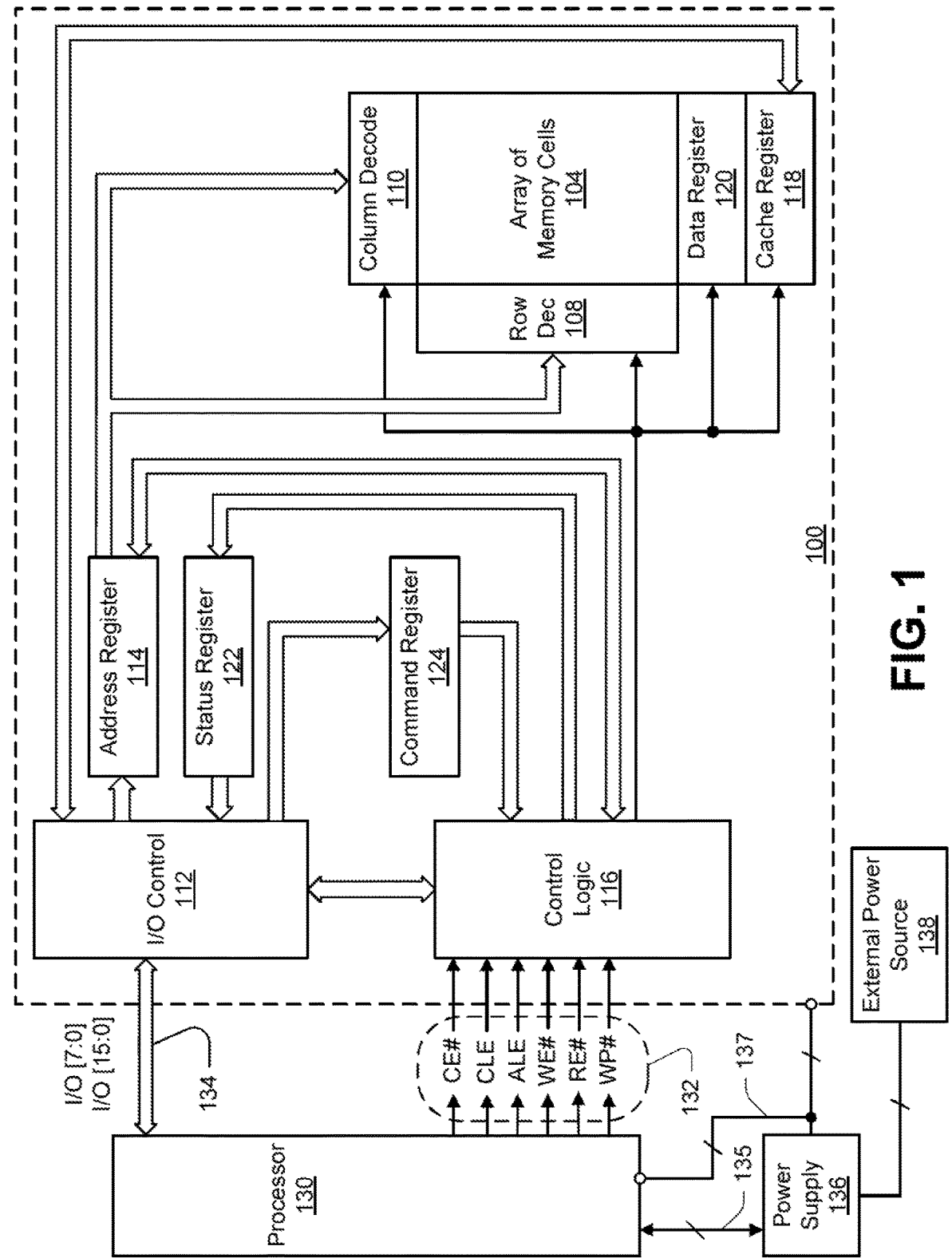
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

Various embodiments may facilitate increased life of a stand-alone power supply in an apparatus by responding to information indicative of available power of the stand-alone power supply, and modifying operation of a memory of the apparatus to facilitate a reduction in power usage by the memory.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 might be configured to perform methods of operating a memory in accordance with embodiments. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a data buffer (e.g., page buffer) of the memory device 100. A data buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

Memory device 100 and/or processor 130 may receive power from a power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two. Power is typically received from the power supply 136 using two or more voltage supply nodes 137, such as a supply voltage node (e.g., Vcc or Vccq) and a reference voltage node (e.g., Vss or Vssq, such as ground or 0V). It is not uncommon for a power supply 136 to provide more than two voltage supply nodes 137. For simplicity, distribution of power from the voltage supply nodes 137 to components within the memory device 100 and processor 130 is not depicted.

The power supply 136 may provide status information to the processor 130 over a status link 135. The status information might include an indication of available power of a stand-alone power supply of the power supply 136. For example, such status information might include an indication of a charge level of the stand-alone power supply, an indication of a percentage of remaining life of the stand-alone power supply, or an indication of an available operating time of the stand-alone power supply, etc. The status information might further include an indication whether a line-connected power supply of the power supply 136 is connected to a live external power source 138, such as a power grid, e.g., an AC (alternating current) power line, or other external power source, e.g., an external battery pack or an inductive charging device. While the status link 135 is depicted to be connected to the processor 130, it could alternatively, or in addition, be connected to the memory device 100 to provide status information directly to the memory device 100.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
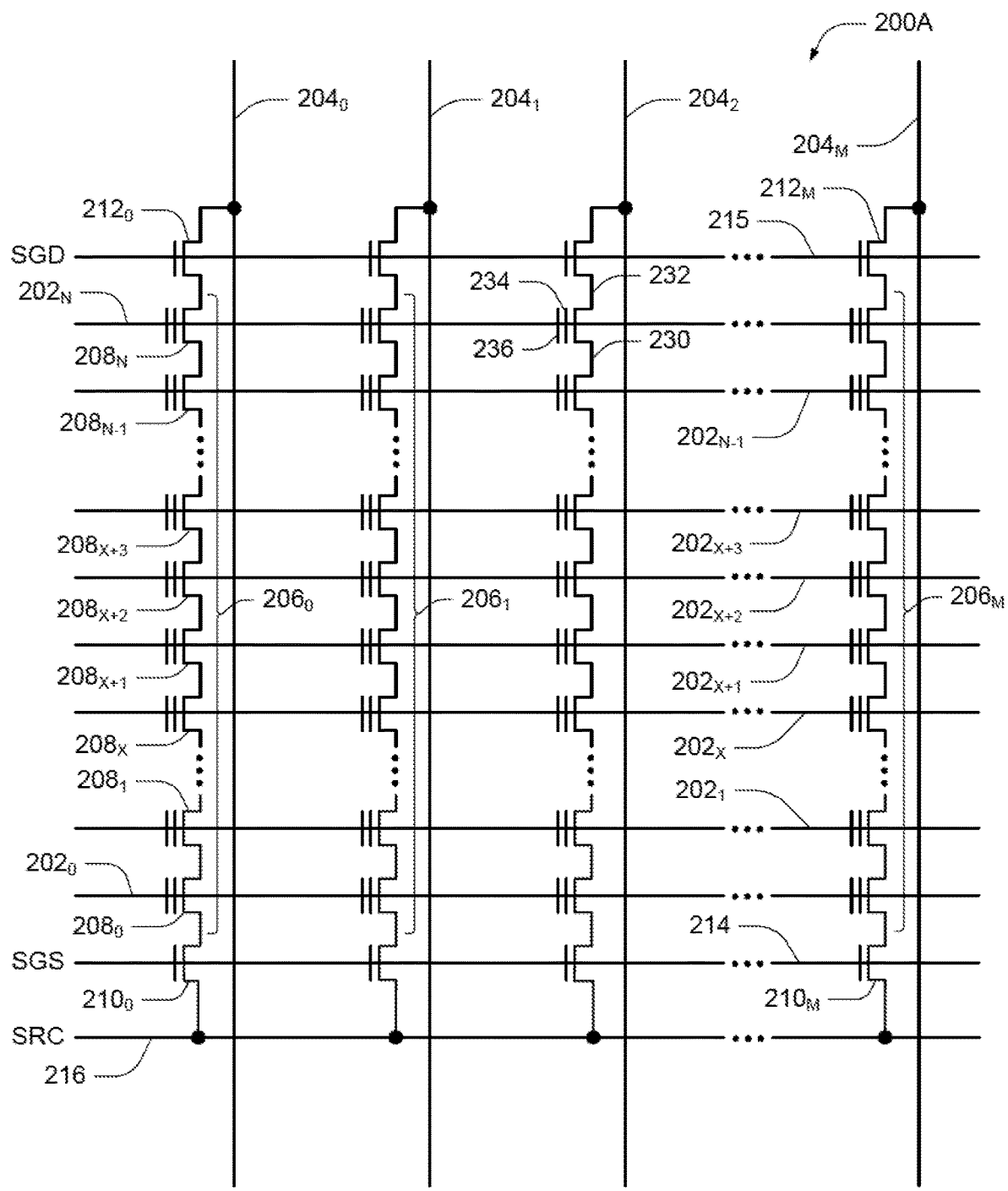
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
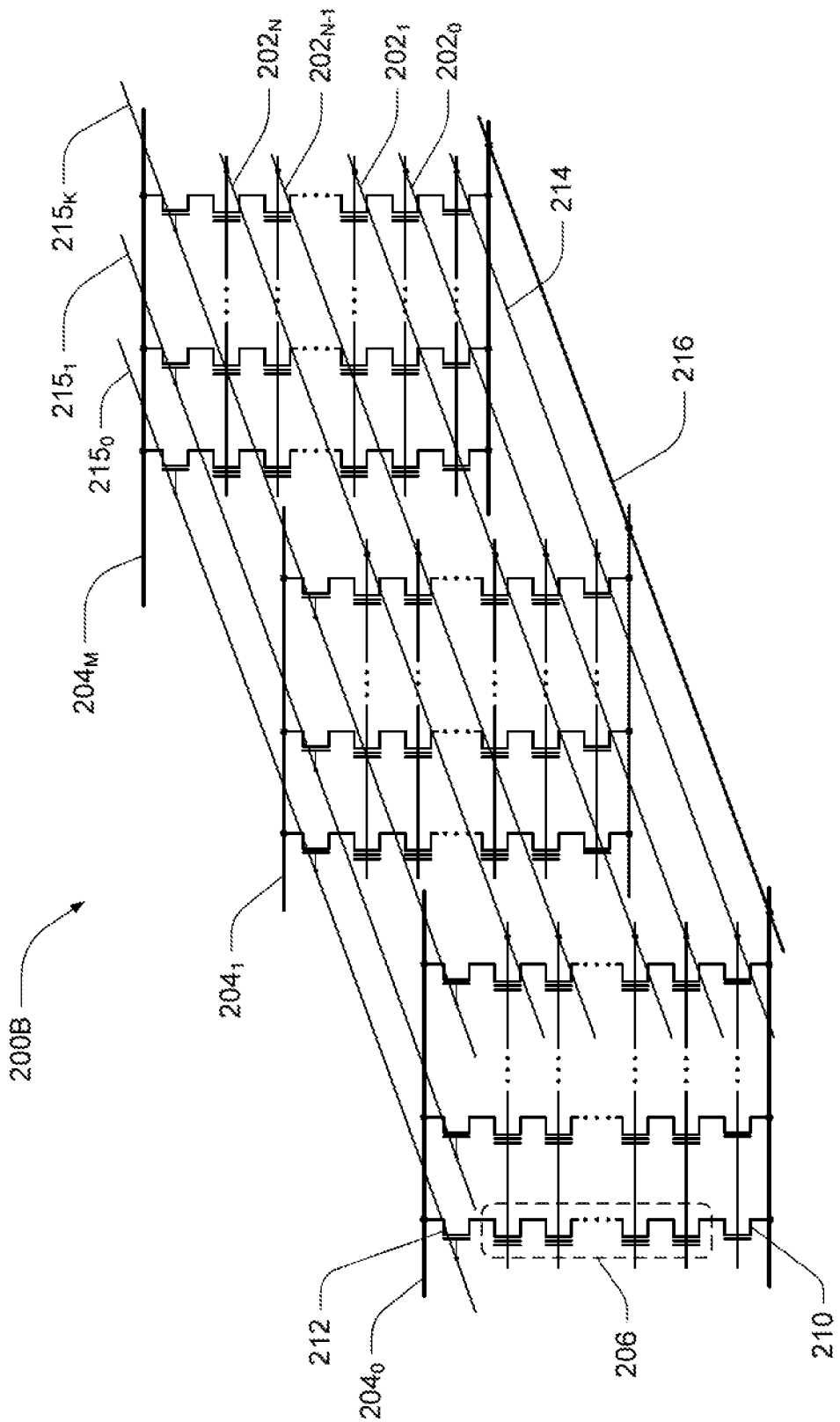

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include string drivers (not shown in FIG. 2B) for connection to word lines 202 of the memory array 200B and having transistors in accordance with embodiments. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
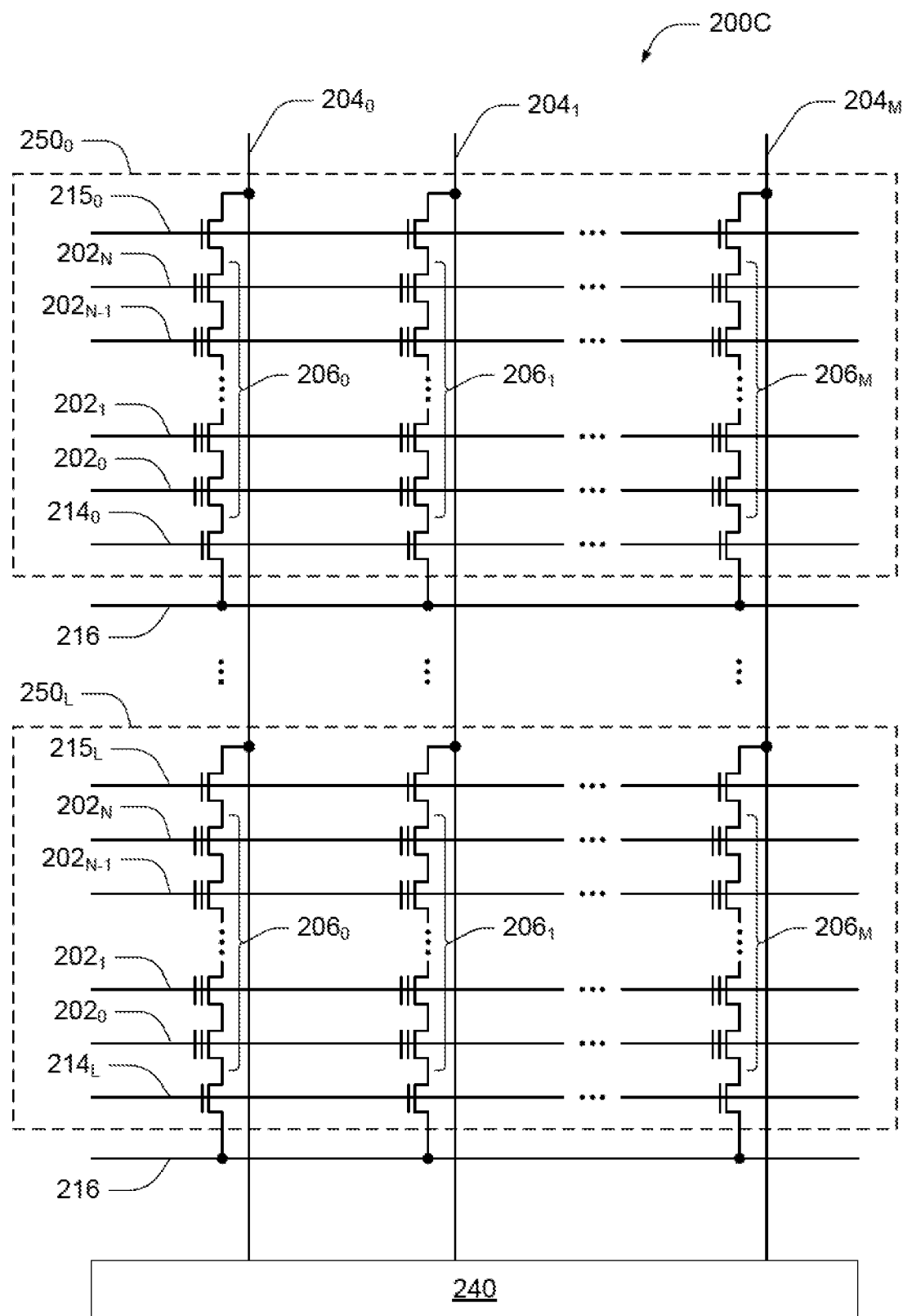

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

While blocks of memory cells 250 might generally have the same physical structure, one or more blocks of memory cells 250 might be operated at one storage density, while one or more other blocks of memory cells 250 might be operated at one or more different storage densities. The internal controller of the memory, e.g., control logic 116, might be configured to access memory cells (e.g., program, read or verify) in one of a plurality of different storage densities. For example, the controller might be configured to access one or more blocks of memory cells 250 as SLC memory cells, and be configured to access one or more other blocks of memory cells 250 as QLC memory cells. The numbers of blocks of memory cells 250 designated for data storage at each storage density used by, or available to, the controller might be programmable.

FIG. 3 is a block schematic of a portion of an array of memory cells as could be used in a memory of the type described with reference to FIG. 1. The array of memory cells 300 might be depicted to have four memory planes 350 (e.g., memory planes $350_0$-$350_3$), each in communication with a respective buffer portion 240, which might collectively form a page buffer 352. While four memory planes 350 are depicted, other numbers of memory planes 350 might be commonly in communication with a page buffer 352. Each memory plane 350 is depicted to include L+1 blocks of memory cells 250 (e.g., blocks of memory cells $250_0$-$250_L$). Other arrangements of blocks of memory cells 250 are known, and a block of memory cells 250 might be a portion of more than one memory plane.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on. Memory cells might also be operated to represent fractional digits of data per memory cells. As an example, two memory cells using three Vt ranges each might collectively represent three digits of data, or 1.5 digits of data per memory cell. The number of digits represented by a single memory cell might be thought of as a storage density of the memory cell, with SLC memory cells having a lower storage density than MLC, TLC, QLC or other higher storage density memory cells.

In general, as storage density increases, so does programming time. Accordingly, it is often the case that memory cells having a lower storage density, e.g., memory cells programmed as SLC memory cells, might be used as a data cache to receive data associated with received write commands, rather than programming that data directly to memory cells having a higher storage density. This can reduce delays that might be experienced by a user attempting to write data to the memory. As the memory has available time, this data might be moved to memory cells having a higher storage density in order to facilitate increased storage capacity of the memory. Although such data caching can reduce programming times visible to a user of the memory, the subsequent movement of data increases the energy requirements to store that data.

Figure 4A:
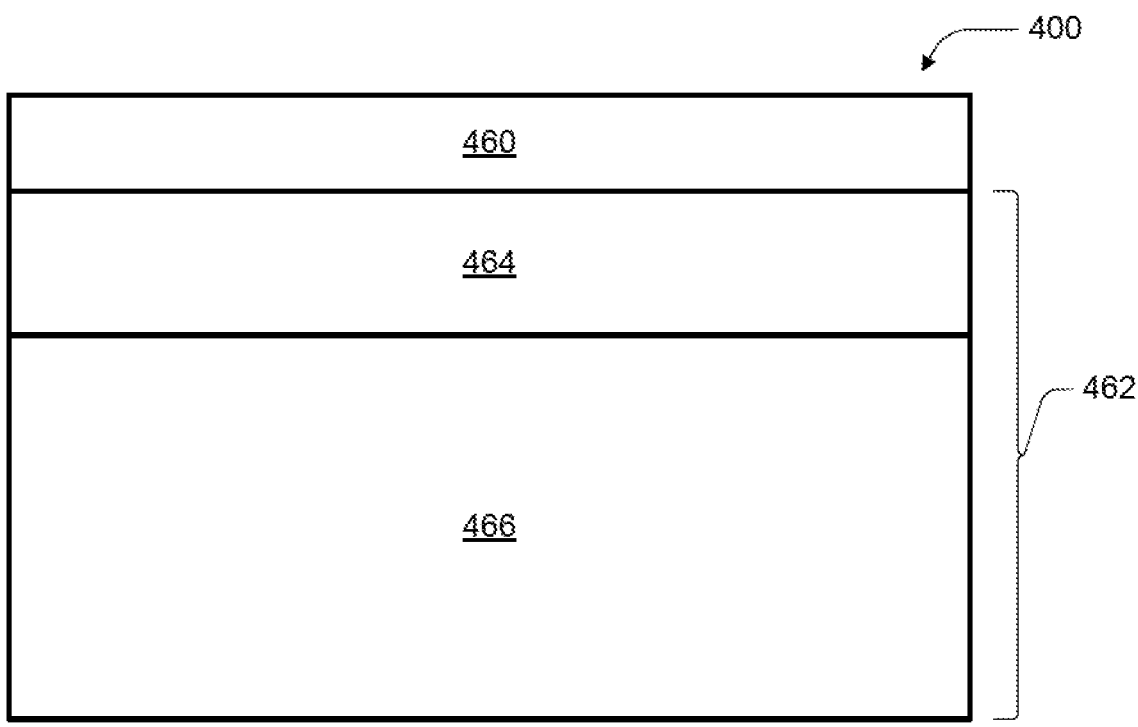
FIGS. 4A-4B are conceptual block diagrams demonstrating aspects of operating a memory in accordance with embodiments.
Figure 4B:
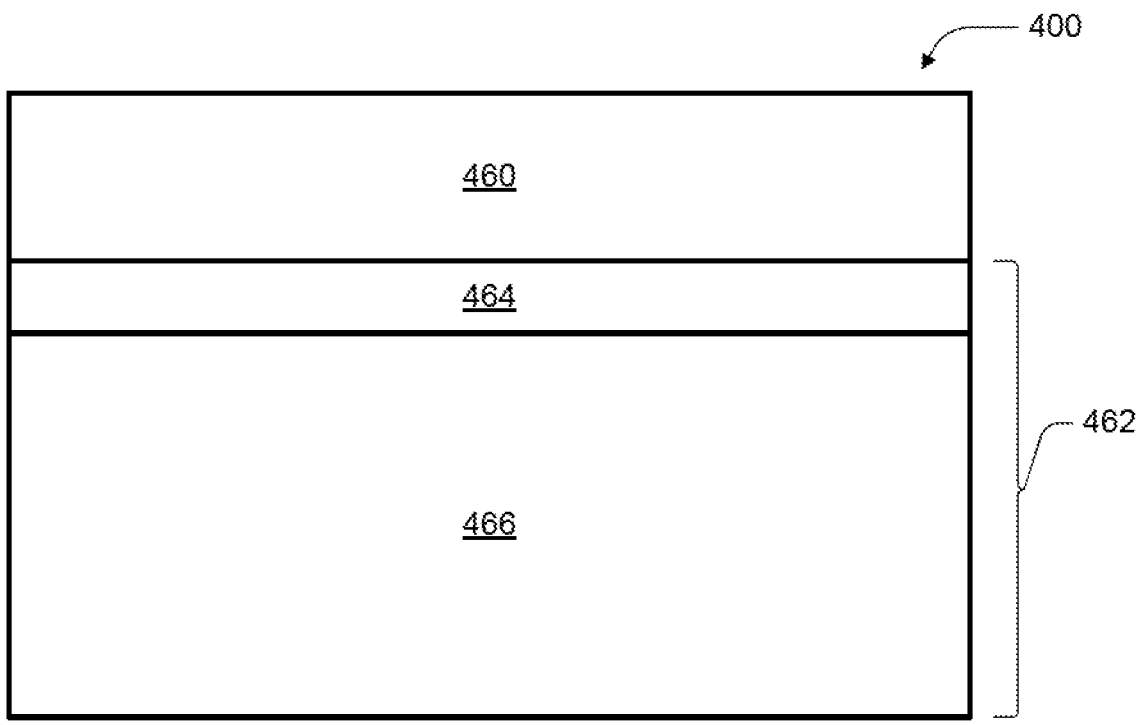

FIGS. 4A-4B are conceptual block diagrams demonstrating aspects of operating a memory in accordance with embodiments. In particular, FIGS. 4A-4B might represent allocations of blocks of memory cells of an array of memory cells 400. Although the following discussion will refer to blocks of memory cells, other groupings of memory cells, e.g., logical pages of memory cells or physical pages of memory cells, might alternatively be used.

In FIG. 4A, the array of memory cells 400 might have a first pool of memory cells 460 having a first storage density. For example, a controller of the memory containing the array of memory cells 400 might be configured to program memory cells of the first pool of memory cells 460 as SLC memory cells. The first storage density might be a lowest storage density to which the controller of the memory is configured to program memory cells of the array of memory cells 400.

The array of memory cells 400 might have a second pool of memory cells 462 having a second storage density greater than the first storage density. For example, the controller of the memory containing the array of memory cells 400 might be configured to program memory cells of the second pool of memory cells 462 as MLC memory cells, TLC memory cells, QLC memory cells, etc. The second pool of memory cells 462 might include memory cells of more than one storage density, each greater than the first storage density. For example, some memory cells of the pool of memory cells 462 might be programmed as TLC memory cells while other memory cells of the pool of memory cells 462 might be programmed as QLC memory cells.

Blocks of memory cells of the first pool of memory cells 460 might be used as a data cache, although some blocks of memory cells of the first pool of memory cells 460 might alternatively be used for storage of data requiring higher reliability, with no intention to move that data to the second pool of memory cells 462. Although not explicitly depicted, the first pool of memory cells 460 might include blocks of memory cells containing no data, e.g., free blocks of memory cells, as well as blocks of memory cells containing valid or obsolete data.

The second pool of memory cells 462 might have a first portion 464 of blocks of memory cells available to receive data, e.g., free blocks of memory cells. The second pool of memory cells 462 might also have a second portion 466 of blocks of memory cells containing valid or obsolete data.

For various embodiments, it may be desirable to operate a memory in both a normal power mode, e.g., a default power mode, and a different power mode, e.g., a low power mode, that may include increasing a pool of low storage density memory cells, e.g., the first pool of memory cells 460, by re-allocating memory cells of a pool of higher storage density memory cells, e.g., the second pool of memory cells 462. This might include re-allocating free blocks of memory cells of the first portion 464 of the second pool of memory cells 462. FIG. 4B might represent such a re-allocation of memory cells.

In FIG. 4B, the first pool of memory cells 460 of the array of memory cells 400 is increased in size. This increase in size might be facilitated by reducing the size of the first portion 464 of the second pool of memory cells 462 as depicted in FIG. 4B. There may be no change in size of the second portion 466 of the second pool of memory cells 462. However, the second pool of memory cells 462 might generally be smaller in FIG. 4B as a result of the reduction in size of the first portion 464 of the second pool of memory cells 462, e.g., a reduction in the number of free blocks of memory cells of the second storage density. Upon exiting the low power mode, the memory might seek to return to the allocation of FIG. 4A, e.g., restoring the sizes of the first pool of memory cells 460 and the second pool of memory cells 462 to their previous sizes.

Figure 5:
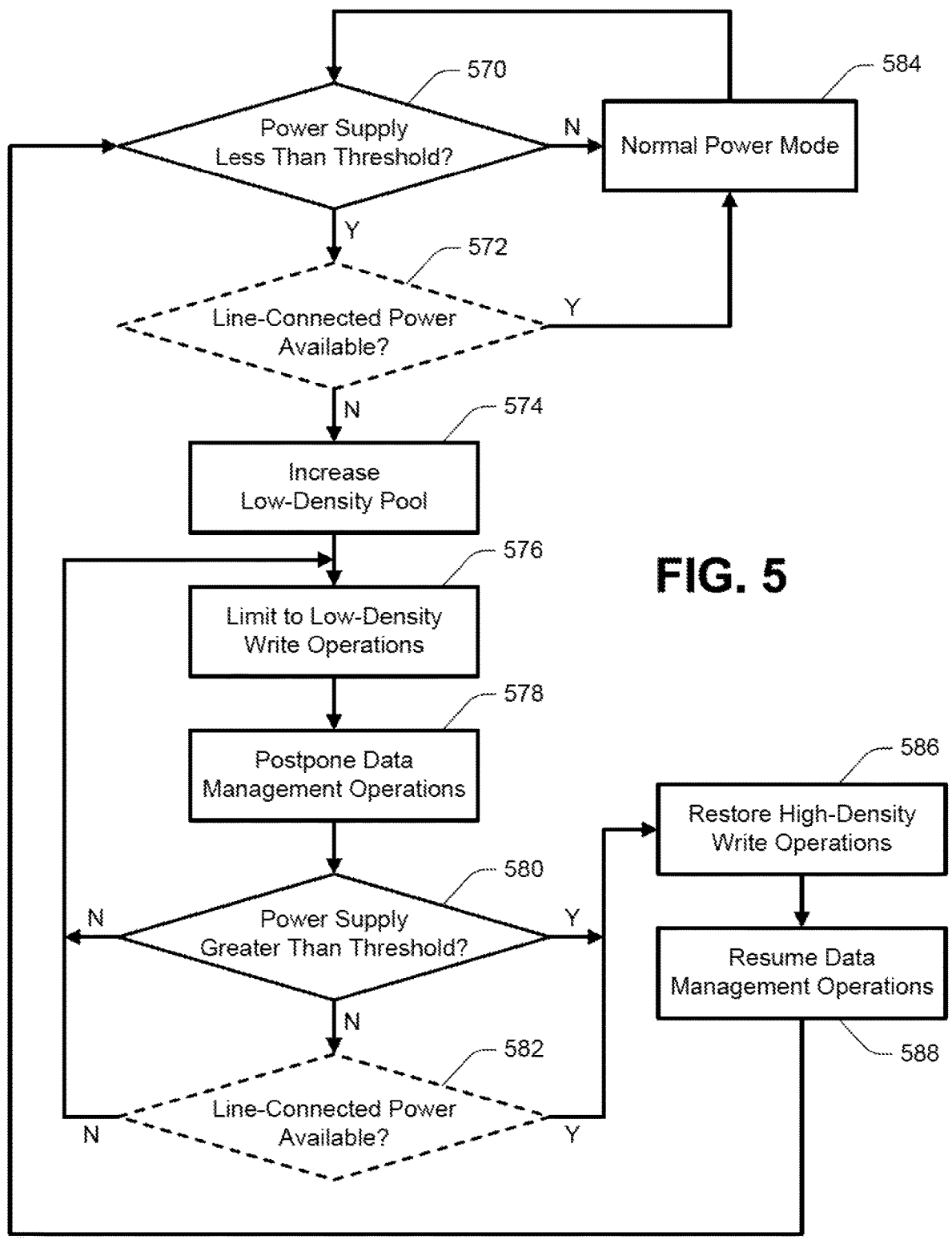
FIG. 5 is a flowchart of a method of operating a memory in accordance with an embodiment.

FIG. 5 is a flowchart of a method of operating a memory in accordance with an embodiment. At 570, it might be determined whether a value of an indication of available power of a power supply for the memory, e.g., a stand-alone power supply, is less than a threshold, e.g., a predetermined threshold. This determination might be performed by a controller external to the memory, e.g., processor 130, or by a controller internal to the memory, e.g., control logic 116.

For some embodiments, it might be determined whether the value of the indication of available power is less than or equal to the threshold.

The value of the threshold might be selectable by a user of the memory, or it might be selected at a time of manufacture. The threshold might be selected to represent a low power condition of a stand-alone power supply that is still sufficient to operate the memory. As an example, the threshold might correspond to 5% of remaining life of the stand-alone power supply. Other values of the threshold may be used. It is noted, however, that higher values of the threshold may lead to reductions in life of the memory relative to lower values of the threshold as blocks of memory cells may experience higher numbers of program-erase cycles with higher values of the threshold.

If the value of the indication of available power is determined not to be less than (or equal to) the threshold at 570, the memory may operate, e.g., continue to operate, in a normal power mode, e.g., a default power mode, at 584. If the value of the indication of available power is determined to be less than (or equal to) the threshold at 570, the method might optionally proceed to 572. Alternatively, the method might proceed to 574. In such a case, when the determination is performed by a controller external to the memory, the controller might issue a command to the memory to enter a different power mode, e.g., a low power mode.

At 572, it might optionally be determined whether line-connected power is available to the power supply. Again, this determination might be performed by a controller external to the memory, e.g., processor 130, or by a controller internal to the memory, e.g., control logic 116. If line-connected power is available, even if the value of the indication of available power is determined to be less than (or equal to) the threshold at 570, the memory may operate, e.g., continue to operate, in a normal power mode, e.g., a default power mode, at 584. If line-connected power is not available, the method may proceed to 574 to enter the low power mode. In such a case, when the determination is performed by a controller external to the memory, the controller might issue a command to the memory to enter the low power mode.

At 574, a pool of low storage density memory cells, e.g., the first pool of memory cells 460, might be increased, such as by reducing a size of a pool of higher storage density memory cells, e.g., the second pool of memory cells 462. Reducing the size of the second pool of memory cells 462 might correspond to reducing the size of the first portion 464 of the second pool of memory cells 462. The pool of low storage density memory cells might alternatively be referred to as a low-density pool, while the pool of higher storage density memory cells might alternatively be referred to as a high-density pool.

The magnitude of the increase might be determined in response to a value of the threshold. For example, the magnitude of the increase, e.g., a number of blocks of memory cells, might be selected such that available power would be expected to run out before the number of memory cells available to receive data in the pool of low storage density memory cells could be programmed. In this manner, higher values of the threshold might result in greater magnitudes of the increase. The magnitude of the increase might further account for the number of memory cells available to receive data in the pool of low storage density memory cells before determining whether the value of the indication of available power is less than the threshold, e.g., higher numbers of memory cells already available to receive data might result in lesser magnitudes of the increase. Alternatively, or in addition, the magnitude of the increase might be limited such that a number of memory cells available to receive data in the pool of higher storage density memory cells, after its corresponding decrease in size, is capable of receiving data stored to each memory cell of the pool of low storage density memory cells whose data is intended to be subsequently moved to the pool of higher storage density memory cells.

At 576, write operations to the memory might be limited to programming memory cells of the pool of low storage density memory cells. For example, write operations might be limited to programming memory cells to a lowest storage density of an array of memory cells, such as programming memory cells as SLC memory cells or MLC memory cells. Programming memory cells of the pool of higher storage density memory cells might be prohibited. For some embodiments, if no memory cells of the pool of low storage density memory cells are available to receive data, the memory might further limit access of the memory cells of the pool of low storage density memory cells, and of the memory cells of the pool of higher storage density memory cells, to read only.

At 578, data management operations might be postponed, e.g., until a line-connected power supply is available or a stand-alone power supply otherwise indicates a threshold greater than (or equal to) the threshold. Data management operations generally are operations performed to improve device operation and/or reliability, and may be independent of the storage of received data or the output of requested data. One data management operation, as noted with respect to data caching, might include the movement of data from memory cells of lower storage density to memory cells of higher storage density when the memory has available time. However, such movement of data increases the power demand of the memory. Accordingly, in the low power mode, it may be desirable to restrict, e.g., cease, such movement of data.

Other data management operations might also be postponed to further reduce power demands. As an example of another data management operation, a memory might perform a wear leveling operation by moving data around within a memory array in an effort to generally equalize wear of the memory cells. Another data management operation might be a housekeeping operation that removes obsolete data in order to free up memory blocks by erasing them for re-use. Other data management operations might include read disturb scanning or scanning of firmware for reliability issues. These operations are typically performed in the background without the knowledge of a host and, in some embodiments, are performed autonomously by the memory (e.g., are initiated without being commanded by the host). For some embodiments, all data management operations (e.g., all non-essential data management operations) might be postponed at 578.

At 580, it might be determined whether the value of the indication of available power of the power supply for the memory, e.g., a stand-alone power supply, is greater than the threshold. For some embodiments, it might be determined whether the value of the indication of available power is greater than or equal to the threshold. If the value of the indication of available power is determined to be greater than (or equal to) the threshold at 580, the method might proceed to 586. When the determination is performed by a controller external to the memory, the controller might issue a command to the memory to exit the low power mode. If the value of the indication of available power is determined to not be greater than (or equal to) the threshold at 580, the method might return to 576, or might optionally proceed to 582.

At 582, it might optionally be determined whether line-connected power is available to the power supply. If line-connected power is available, even if the value of the indication of available power is determined to not be greater than (or equal to) the threshold at 580, the method might proceed to 586. If line-connected power is not available, the method might return to 576.

At 586, the restriction to limit programming to memory cells of the pool of low storage density memory cells might be removed. For example, write operations might again be permitted to program memory cells to one or more memory cells of the array of memory cells operated at higher storage densities, such as programming memory cells of the second pool of memory cells 462.

At 588, data management operations, e.g., those postponed at 578, might be resumed. Resuming data management operations might be on a time-available basis for the memory to facilitate transparency to a user of the memory. Data management operations might be queued based on perceived or predefined priority. For example, data management operations relevant to reliability of the memory might be prioritized over data management operations to consolidate data in higher storage density memory cells. Resuming data management operations to consolidate data in higher storage density memory cells might facilitate restoring the pool of higher storage density memory cells to its size prior to increasing the size of the pool of low storage density memory cells as will be discussed with reference to FIG. 7B. The method might further return to 570 to monitor the value of the indication of available power.

Figure 6:
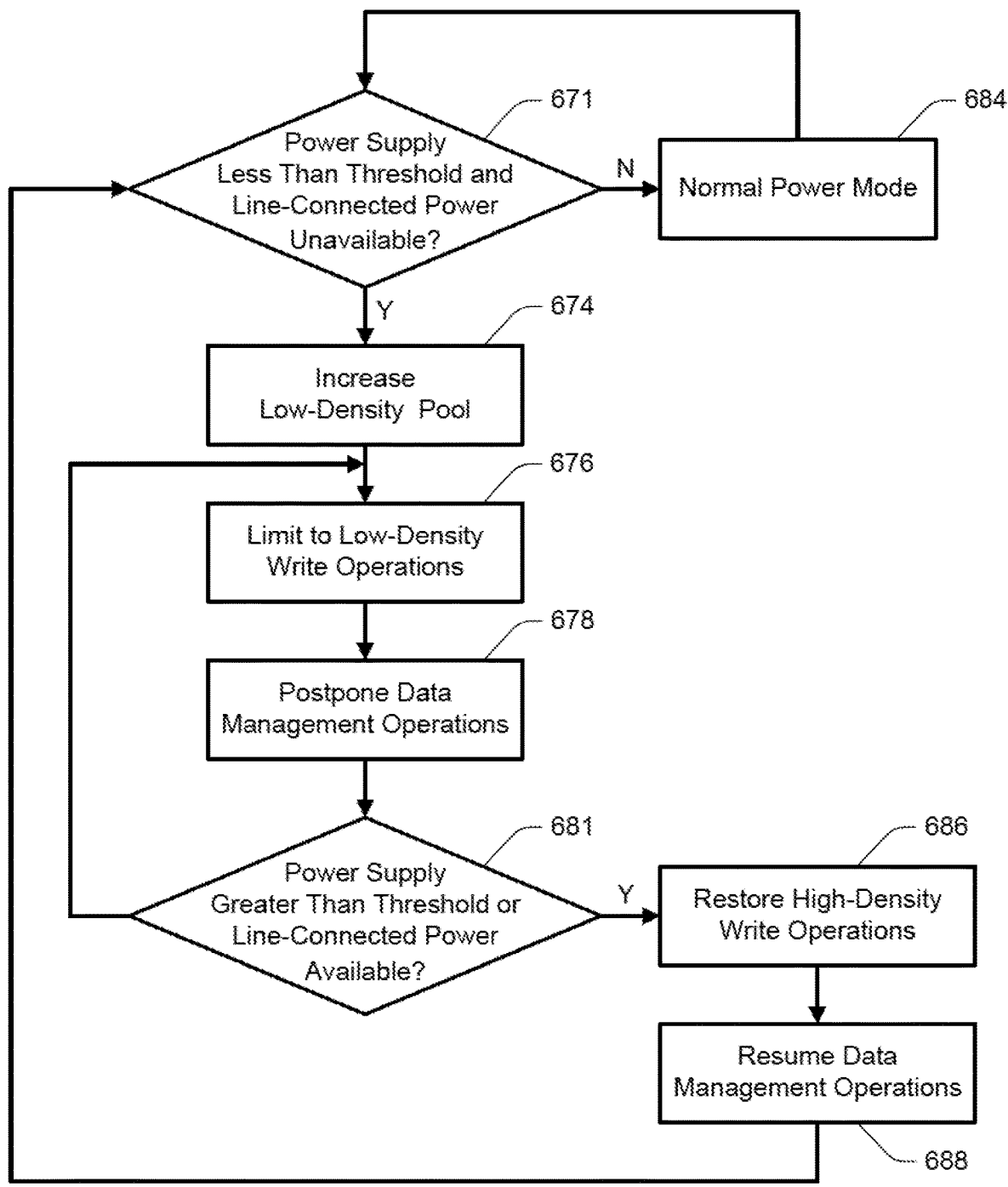
FIG. 6 is a flowchart of a method of operating a memory in accordance with an embodiment.

FIG. 6 is a flowchart of a method of operating a memory in accordance with another embodiment. At 671, it might be determined whether a value of an indication of available power of a power supply for the memory, e.g., a stand-alone power supply, is less than a threshold, e.g., a predetermined threshold and line-connected power is unavailable. This determination might be performed by a controller external to the memory, e.g., processor 130, or a controller internal to the memory, e.g., control logic 116. For some embodiments, it might be determined whether the value of the indication of available power is less than or equal to the threshold.

The value of the threshold might be selectable by a user of the memory, or it might be selected at a time of manufacture. The threshold might be selected to represent a low power condition of a stand-alone power supply that is still sufficient to operate the memory. As an example, the threshold might correspond to 5% of remaining life of the stand-alone power supply. Other values of the threshold may be used. It is noted, however, that higher values of the threshold may lead to reductions in life of the memory relative to lower values of the threshold as blocks of memory cells may experience higher numbers of program-erase cycles with higher values of the threshold.

If the value of the indication of available power is determined not to be less than (or equal to) the threshold, or line-connected power is available at 671, the memory may operate, e.g., continue to operate, in a normal power mode, e.g., a default power mode, at 684. If the value of the indication of available power is determined to be less than (or equal to) the threshold, or line-connected power is available at 671, the method may proceed to 674. In such a case, when the determination is performed by a controller external to the memory, the controller might issue a command to the memory to enter a different power mode, e.g., a low power mode.

At 674, a pool of low storage density memory cells, e.g., the first pool of memory cells 460, might be increased, such as by reducing a size of a pool of higher storage density memory cells, e.g., the second pool of memory cells 462. At 676, write operations to the memory might be limited to programming memory cells of the pool of low storage density memory cells. For example, write operations might be limited to programming memory cells to a lowest storage density of an array of memory cells, such as programming memory cells as SLC memory cells or MLC memory cells. Programming memory cells of the pool of higher storage density memory cells might be prohibited.

At 678, data management operations might be postponed, e.g., until a line-connected power supply is available or a stand-alone power supply otherwise indicates a threshold greater than (or equal to) the threshold. Data management operations generally are operations performed to improve device operation and/or reliability, and may be independent of the storage of received data or the output of requested data. One data management operation, as noted with respect to data caching, might include the movement of data from memory cells of lower storage density to memory cells of higher storage density when the memory has available time. However, such movement of data increases the power demand of the memory. Accordingly, in the low power mode, it may be desirable to restrict, e.g., cease, such movement of data.

Other data management operations might also be postponed to further reduce power demands. As an example of another data management operation, a memory might perform a wear leveling operation by moving data around within a memory array in an effort to generally equalize wear of the memory cells. Another data management operation might be a housekeeping operation that removes obsolete data in order to free up memory blocks by erasing them for re-use. Other data management operations might include read disturb scanning or scanning of firmware for reliability issues. These operations are typically performed in the background without the knowledge of a host and, in some embodiments, are performed autonomously by the memory (e.g., are initiated without being commanded by the host). For some embodiments, all data management operations (e.g., non-essential data management operations) might be postponed at 678.

At 681, it might be determined whether the value of the indication of available power of a power supply for the memory, e.g., a stand-alone power supply, is greater than (or equal to) the threshold, or line-connected power is available. If the value of the indication of available power is determined to be greater than (or equal to) the threshold, or line-connected power is available at 681, the method might proceed to 686. When the determination is performed by a controller external to the memory, the controller might issue a command to the memory to exit the low power mode. If the value of the indication of available power is determined to not be greater than (or equal to) the threshold, and line-connected power is unavailable at 681, the method might return to 676.

At 686, the restriction to limit programming to memory cells of the pool of low storage density memory cells might be removed. For example, write operations might again be permitted to program memory cells to one or more memory cells of the array of memory cells operated at higher storage densities, such as programming memory cells of the second pool of memory cells 462.

At 688, data management operations, e.g., those postponed at 678, might be resumed. Resuming data management operations might be on a time-available basis for the memory to facilitate transparency to a user of the memory. Data management operations might be queued based on perceived or predefined priority. For example, data management operations relevant to reliability of the memory might be prioritized over data management operations to consolidate data in higher storage density memory cells. Resuming data management operations to consolidate data in higher storage density memory cells might facilitate restoring the pool of higher storage density memory cells to its size prior to increasing the size of the pool of low storage density memory cells as will be discussed with reference to FIG. 7B. The method might further return to 671 to monitor the indication of available power.

Figure 7:
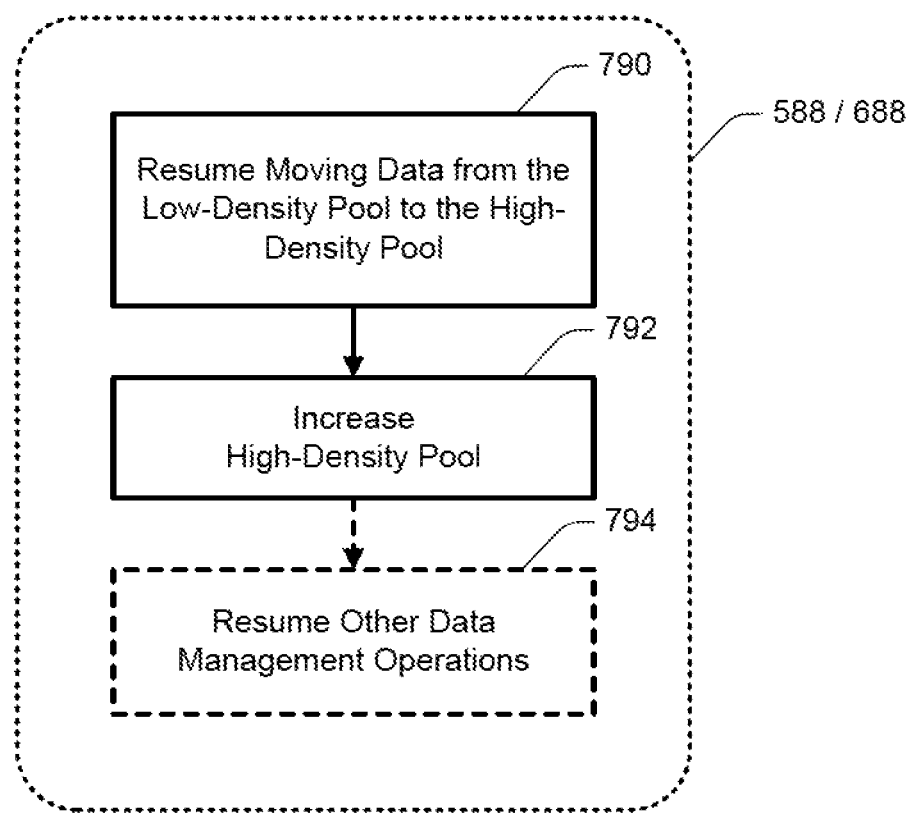
FIG. 7 is a flowchart of a method of operating a memory in accordance with an embodiment providing an option for aspects of the methods of FIGS. 5 and 6.

FIG. 7 is a flowchart of a method of operating a memory in accordance with an embodiment providing an option for aspects of the methods of FIGS. 5 and 6. In particular, FIG. 7 provides additional detail on the resumption of data management operations at 588 of FIG. 5 and/or at 688 of FIG. 6.

At 790, the memory might resume moving data from memory cells of lower storage density, e.g., memory cells of the first pool of memory cells 460, to memory cells of higher storage density, e.g., memory cells of the second pool of memory cells 462. As data is moved, memory cells, e.g., blocks of memory cells, of the first pool of memory cells 460 can become free. Such free memory cells, e.g., free blocks of memory cells, can then be assigned to the second pool of memory cells 462 in order to increase the size of the second pool of memory cells 462 at 792, e.g., to restore the second pool of memory cells 462 to its size prior to increasing the size of the first pool of memory cells 460. It is noted that free memory cells, e.g., free blocks of memory cells, might remain in the first pool of memory cells 460 at the time of exiting the low power mode. For example, blocks of memory cells of the first pool of memory cells 460 available to receive data might not have been programmed during the low power mode. Such free memory cells might be assigned to the second pool of memory cells 462 without requiring movement of data.

At 794, other data management operations might also be resumed. Although 794 is depicted to follow 790, such other data management operations might alternatively or in addition be performed prior to 790, or concurrently with 790, depending upon any priority that might be assigned to particular data management operations. For some embodiments, other data management operations might be delayed until all valid data stored to the memory cells of lower storage density while in the low power mode are moved to memory cells of higher storage density at 790.

Figure 8:
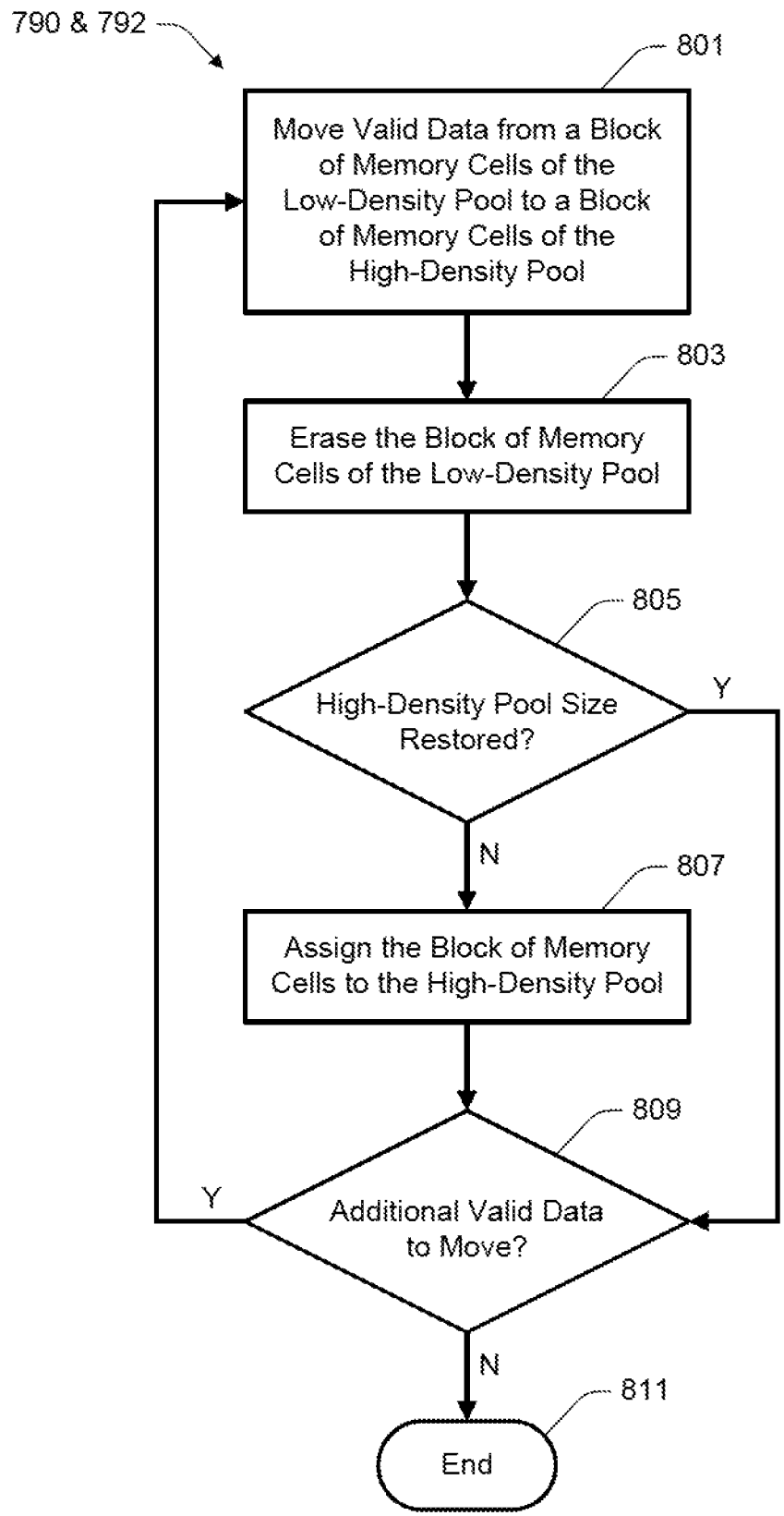
FIG. 8 is a flowchart of a method of operating a memory in accordance with an embodiment providing an option for aspects of the method of FIG. 7.

FIG. 8 is a flowchart of a method of operating a memory in accordance with an embodiment providing an option for aspects of the method of FIG. 7. In particular, FIG. 8 provides additional detail on a process to increase the size of the second pool of memory cells 462 in response to moving data from memory cells of the first pool of memory cells 460.

At 801, valid data might be moved from a block of memory cells of lower storage density, e.g., memory cells of the first pool of memory cells 460, to a block of memory cells of higher storage density, e.g., memory cells of the second pool of memory cells 462. At 803, after movement of valid data, that block of memory cells of the lower storage density might be erased.

At 805, it might be determined whether the size of the second pool of memory cells 462 has been restored to a desired size. If the size of the second pool of memory cells 462 has not been restored to its desired size, the method might proceed to 807. If the size of the second pool of memory cells 462 has been restored to its desired size, the method might proceed to 809.

At 807, the erased block of memory cells might be assigned to the second pool of memory cells 462. At 809, it might be determined whether there is additional valid data to move from memory cells of the first pool of memory cells 460. If there is no additional valid data to move, the method might end at 811. If there is additional valid data to move, the method might return to 801 to repeat the process on its corresponding block of memory cells, e.g., a different or next block of memory cells of the first pool of memory cells 460.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory having a first pool of memory cells having a first storage density and a second pool of memory cells having a second storage density greater than the first storage density, the method comprising:
   determining whether a value of an indication of available power of a power supply for the memory is less than a threshold;
   in response to determining that the value of the indication of available power is less than the threshold:
      increasing a size of the first pool of memory cells;
      limiting write operations of the memory, performed in response to write commands received by the memory, to storing data associated with the write commands to the first pool of memory cells at the first storage density; and
      postponing movement of data from the first pool of memory cells to the second pool of memory cells.

2. The method of claim 1, wherein determining whether the value of the indication of available power is less than the threshold comprises determining whether the value of the indication of available power is less than or equal to the threshold.

3. The method of claim 1, wherein limiting write operations of the memory to the first pool of memory cells comprises prohibiting write operations of the memory to the second pool of memory cells.

4. The method of claim 1, wherein postponing movement of data from the first pool of memory cells to the second pool of memory cells comprises prohibiting movement of data from the first pool of memory cells to the second pool of memory cells.

5. The method of claim 1, wherein increasing the size of the first pool of memory cells comprises increasing the size of the first pool of memory cells by a magnitude selected in response to a value of the threshold.

6. The method of claim 1, wherein increasing the size of the first pool of memory cells comprises reallocating memory cells of the second pool of memory cells to the first pool of memory cells.

7. The method of claim 1, wherein determining whether the value of the indication of available power is less than the threshold further comprises determining whether the value of the indication of available power is less than the threshold and determining whether line-connected power is available.

8. A method of operating a memory having a first pool of memory cells having a first storage density and a second pool of memory cells having a second storage density greater than the first storage density, the method comprising:
  determining whether a value of an indication of available power of a power supply for the memory is less than a threshold;
  in response to determining that the value of the indication of available power is less than the threshold:
    increasing a size of the first pool of memory cells, wherein increasing the size of the first pool of memory cells comprises reallocating memory cells of the second pool of memory cells to the first pool of memory cells;
    limiting a number of memory cells of the second pool of memory cells to reallocate such that the second pool of memory cells retains sufficient memory cells available to receive all data from the number of memory cells reallocated to the first pool of memory cells after programming;
    limiting write operations of the memory to the first pool of memory cells; and
    postponing movement of data from the first pool of memory cells to the second pool of memory cells.

9. A method of operating a memory having a first pool of memory cells having a first storage density and a second pool of memory cells having a second storage density greater than the first storage density, the method comprising:
  determining whether a value of an indication of available power of a power supply for the memory is less than a threshold;
  in response to determining that the value of the indication of available power is less than the threshold:
    increasing a size of the first pool of memory cells;
    limiting write operations of the memory to the first pool of memory cells;
    postponing movement of data from the first pool of memory cells to the second pool of memory cells;
    monitoring the value of the indication of available power to determine if the value of the indication of available power becomes greater than the threshold; and
      in response to determining that the value of the indication of available power becomes greater than the threshold:
        allowing write operations of the memory to the second pool of memory cells; and
        permitting movement of data from the first pool of memory cells to the second pool of memory cells.

10. The method of claim 9, wherein monitoring the value of the indication of available power to determine if the value of the indication of available power becomes greater than the threshold comprises monitoring the value of the indication of available power to determine if the value of the indication of available power becomes greater than or equal to the threshold.

11. The method of claim 9, further comprising increasing a size of the second pool of memory cells in response to determining that the value of the indication of available power becomes greater than the threshold.

12. The method of claim 11, wherein increasing the size of the second pool of memory cells comprises:
  moving valid data from a block of memory cells of the first pool of memory cells to a block of memory cells of the second pool of memory cells;
  erasing the block of memory cells of the first pool of memory cells; and
  assigning the erased block of memory cells of the first pool of memory cells to the second pool of memory cells.

13. A method of operating a memory having a first pool of memory cells having a first storage density and a second pool of memory cells having a second storage density greater than the first storage density, the method comprising:
  determining whether a value of an indication of available power of a power supply for the memory is less than a threshold and determining whether line-connected power is available;
  in response to determining that the value of the indication of available power is less than the threshold and determining that the line-connected power is not available:
    increasing a size of the first pool of memory cells;
    limiting write operations of the memory to the first pool of memory cells; and
    postponing movement of data from the first pool of memory cells to the second pool of memory cells.

14. The method of claim 13, further comprising:
  in further response to determining that the value of the indication of available power is less than threshold and determining that the line-connected power is not available:
    monitoring the value of the indication of available power to determine if the value of the indication of available power becomes greater than the threshold or the line-connected power is available; and
      in response to determining that value of the indication of available power becomes greater than the threshold or determining that the line-connected power is available:
        allowing write operations of the memory to the second pool of memory cells; and
        permitting movement of data from the first pool of memory cells to the second pool of memory cells.

15. A method of operating a memory having a first pool of memory cells having a first storage density and a second pool of memory cells having a second storage density greater than the first storage density, the method comprising:
  determining whether a value of an indication of available power of a power supply for the memory is less than a threshold and whether line-connected power is available to the power supply;
  in response to determining that the value of the indication of available power is less than the threshold and that line-connected power is not available:
    increasing a size of the first pool of memory cells;
    limiting write operations of the memory, performed in response to write commands received by then memory, to storing data associated with the write commands to the first pool of memory cells at the first storage density; and postponing movement of data from the first pool of memory cells to the second pool of memory cells.

16. The method of claim 15, wherein determining whether the value of the indication of available power is less than the threshold comprises determining whether the value of the indication of available power is less than or equal to the threshold.

17. A method of operating a memory having a first pool of memory cells having a first storage density and a second pool of memory cells having a second storage density greater than the first storage density, the method comprising:
 determining whether a value of an indication of available power of a power supply for the memory is less than a threshold and whether line-connected power is available to the power supply;
 in response to determining that the value of the indication of available power is less than the threshold and that line-connected power is not available:
  increasing a size of the first pool of memory cells;
  limiting write operations of the memory to the first pool of memory cells;
  postponing movement of data from the first pool of memory cells to the second pool of memory cells;
  monitoring the value of the indication of available power to determine if the value of the indication of available power becomes greater than the threshold or line-connected power becomes available to the power supply; and
   in response to determining that the value of the indication of available power becomes greater than the threshold or determining that the line-connected power becomes available:
    allowing write operations of the memory to the second pool of memory cells; and
    permitting movement of data from the first pool of memory cells to the second pool of memory cells.

18. The method of claim 17, wherein monitoring the value of the indication of available power to determine if the value of the indication of available power becomes greater than the threshold comprises monitoring the value of the indication of available power to determine if the value of the indication of available power becomes greater than or equal to the threshold.

19. The method of claim 17, further comprising increasing a size of the second pool of memory cells in response to determining that the value of the indication of available power becomes greater than the threshold or determining that the line-connected power becomes available.

20. The method of claim 19, wherein increasing the size of the second pool of memory cells comprises restoring the size of the second pool of memory cells to its size before increasing the size of the first pool of memory cells.

21. An apparatus, comprising:
 a power supply;
 a first controller configured to receive power from the power supply and configured to receive a value of an indication of available power of the power supply; and
 a memory in communication with the first controller and configured to receive power from the power supply, wherein the memory comprises an array of memory cells and a second controller for accessing the array of memory cells;
 wherein the apparatus is configured to:
  access a first pool of memory cells of the array of memory cells using a first storage density;
  access a second pool of memory cells of the array of memory cells using a second storage density greater than the first storage density;
  determine whether the value of the indication of available power is less than a threshold; and
  in response to determining that the value of the indication of available power is less than the threshold:
   increase a size of the first pool of memory cells;
   limit write operations of the memory, performed in response to write commands received by the memory, to storing data associated with the write commands to the first pool of memory cells at the first storage density; and
   postpone movement of data from the first pool of memory cells to the second pool of memory cells.

22. The apparatus of claim 21, wherein the apparatus being configured to access the first pool of memory cells of the array of memory cells using the first storage density and to access the second pool of memory cells of the array of memory cells using the second storage density comprises the second controller being configured to access the first pool of memory cells of the array of memory cells using the first storage density and to access the second pool of memory cells of the array of memory cells using the second storage density.

23. The apparatus of claim 21, wherein the apparatus being configured to determine whether the value of the indication of available power is less than the threshold comprises the first controller being configured to determine whether the value of the indication of available power is less than the threshold.

24. The apparatus of claim 21, wherein the apparatus being configured to increase the size of the first pool of memory cells comprises the apparatus being configured to reallocate memory cells of the second pool of memory cells to the first pool of memory cells.

25. An apparatus, comprising:
 a power supply;
 a first controller configured to receive power from the power supply and configured to receive a value of an indication of available power of the power supply; and
 a memory in communication with the first controller and configured to receive power from the power supply, wherein the memory comprises an array of memory cells and a second controller for accessing the array of memory cells;
 wherein the apparatus is configured to:
  access a first pool of memory cells of the array of memory cells using a first storage density;
  access a second pool of memory cells of the array of memory cells using a second storage density greater than the first storage density;
  determine whether the value of the indication of available power is less than a threshold and whether line-connected power is available to the power supply; and
  in response to determining that the value of the indication of available power is less than the threshold and that the line-connected power is not available:
   increase a size of the first pool of memory cells;
   limit write operations of the memory, performed in response to write commands received by the memory, to storing data associated with the write commands to the first pool of memory cells at the first storage density; and postpone movement of data from the first pool of memory cells to the second pool of memory cells.

* * * * *